United States Patent
Jang et al.

(10) Patent No.: US 10,978,541 B2
(45) Date of Patent: Apr. 13, 2021

(54) ORGANIC LIGHT EMITTING DISPLAY DEVICE AND METHOD OF MANUFACTURING THE SAME

(71) Applicant: LG DISPLAY CO., LTD., Seoul (KR)

(72) Inventors: Jin-Hee Jang, Seoul (KR); Se June Kim, Paju-si (KR); Joon Suk Lee, Seoul (KR); So Jung Lee, Paju-si (KR); Jong Hyeok Im, Busan (KR); Jae Sung Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/131,758

(22) Filed: Sep. 14, 2018

(65) Prior Publication Data
US 2019/0027551 A1   Jan. 24, 2019

Related U.S. Application Data

(62) Division of application No. 15/167,456, filed on May 27, 2016, now Pat. No. 10,109,700.

(30) Foreign Application Priority Data

May 29, 2015   (KR) .......................... 10-2015-0076674

(51) Int. Cl.
*H01L 27/32*   (2006.01)
*H01L 51/52*   (2006.01)

(52) U.S. Cl.
CPC ...... *H01L 27/3276* (2013.01); *H01L 51/5218* (2013.01); *H01L 51/5228* (2013.01);
(Continued)

(58) Field of Classification Search
CPC ....................................................... H01L 27/32
(Continued)

(56) References Cited

U.S. PATENT DOCUMENTS

2003/0122498 A1   7/2003   Park
2003/0197187 A1*  10/2003  Kim .................... G02F 1/13458
                                                   257/83
(Continued)

FOREIGN PATENT DOCUMENTS

| CN | 1622715 A | 6/2005 |
| CN | 1030066212 A | 4/2013 |
| CN | 104157693 A | 11/2014 |

*Primary Examiner* — Sheng-Bai Zhu
(74) *Attorney, Agent, or Firm* — Birch, Stewart, Kolasch & Birch, LLP

(57) ABSTRACT

A method of manufacturing an organic light emitting display device, the method includes forming a thin film transistor (TFT) in an active area of a substrate and forming a signal pad and a first pad electrode, connected to the signal pad, in a pad area of the substrate, forming a passivation layer on the TFT and the first pad electrode, forming a planarization layer on the passivation layer, removing a certain region of the passivation layer to simultaneously form an area, through which the TFT is exposed to the outside, and an area through which the first pad electrode is exposed to the outside, forming a first anode electrode connected to the TFT, a first auxiliary electrode spaced apart from the first anode electrode, and a second pad electrode that is connected to the first pad electrode and covers the exposed first pad electrode; and forming a second anode electrode, covering a top and a side surface of the first anode electrode, and a second auxiliary electrode covering a top and a side surface of the first auxiliary electrode.

17 Claims, 6 Drawing Sheets

(52) U.S. Cl.
CPC .. *H01L 27/3246* (2013.01); *H01L 2224/0518* (2013.01); *H01L 2224/05073* (2013.01); *H01L 2224/05166* (2013.01); *H01L 2224/05647* (2013.01); *H01L 2227/323* (2013.01); *H01L 2251/301* (2013.01); *H01L 2924/0132* (2013.01); *H01L 2924/12044* (2013.01)

(58) Field of Classification Search
USPC ........................................ 257/59; 438/23, 22
See application file for complete search history.

(56) References Cited

U.S. PATENT DOCUMENTS

| | | | |
|---|---|---|---|
| 2005/0110023 A1 | 5/2005 | Lee et al. | |
| 2006/0113900 A1* | 6/2006 | Oh | H01L 27/3276 313/504 |
| 2007/0075313 A1* | 4/2007 | Kwak | H01L 27/124 257/59 |
| 2008/0121886 A1 | 5/2008 | Shin | |
| 2008/0218058 A1 | 9/2008 | Son | |
| 2009/0108743 A1* | 4/2009 | Kobayashi | H01L 51/5281 313/504 |
| 2009/0315451 A1* | 12/2009 | Choi | H01L 27/3276 313/504 |
| 2010/0013383 A1* | 1/2010 | Kim | H01L 51/5265 313/504 |
| 2010/0026178 A1* | 2/2010 | Hwang | H01L 51/5215 313/506 |
| 2010/0156273 A1* | 6/2010 | Utsunomiya | H01L 27/3279 313/498 |
| 2010/0244664 A1 | 9/2010 | Fujioka et al. | |
| 2011/0084257 A1* | 4/2011 | Kwon | H01L 27/3276 257/40 |
| 2011/0157681 A1* | 6/2011 | Kwon | G02F 1/167 359/296 |
| 2012/0146060 A1* | 6/2012 | Moon | H01L 27/3276 257/88 |
| 2013/0056784 A1 | 3/2013 | Lee et al. | |
| 2014/0077174 A1* | 3/2014 | Park | H01L 51/5271 257/40 |
| 2014/0225071 A1* | 8/2014 | Park | H01L 51/5203 257/40 |
| 2014/0312323 A1* | 10/2014 | Park | H01L 51/525 257/40 |
| 2014/0339537 A1 | 11/2014 | Bae | |
| 2014/0346448 A1 | 11/2014 | You et al. | |
| 2014/0353620 A1 | 12/2014 | Park et al. | |

* cited by examiner

US 10,978,541 B2

ORGANIC LIGHT EMITTING DISPLAY DEVICE AND METHOD OF MANUFACTURING THE SAME

CROSS-REFERENCE TO RELATED APPLICATIONS

This application is a Divisional of U.S. application Ser. No. 15/167,456, filed on May 27, 2016, which claims priority under 35 U.S.C. § 119(a) to Korean Patent Application No. 10-2015-0076674 filed on May 29, 2015, all of which are hereby expressly incorporated by reference into the present application.

BACKGROUND OF THE INVENTION

Field of the Invention

The present invention relates to an organic light emitting display device, and more particularly, to a top emission type organic light emitting display device and a method of manufacturing the same.

Discussion of the Related Art

Organic light emitting display devices are self-emitting devices and have low power consumption, a fast response time, high emission efficiency, high luminance, and a wide viewing angle.

The organic light emitting display devices are classified into a top emission type and a bottom emission type, based on a transmission direction of light emitted from an organic light emitting device. In the bottom emission type, a circuit element is disposed between an emission layer and an image displaying surface, and for this reason, an aperture ratio is lowered. On the other hand, in the top emission type, the circuit element is not disposed between the emission layer and the image displaying surface, and thus, an aperture ratio is enhanced.

FIG. 1 is a schematic cross-sectional view of a related art top emission type organic light emitting display device.

As seen in FIG. 1, a thin film transistor (TFT) layer T which includes an active layer 11, a gate insulation layer 12, a gate electrode 13, an interlayer dielectric 14, a source electrode 15, and a drain electrode 16 is formed in an active area AA on a substrate 10, and a passivation layer 20 and a planarization layer 30 are sequentially formed on the TFT layer T.

An anode electrode 40 and an auxiliary electrode 50 are formed on the planarization layer 30. The auxiliary electrode 50 decreases a resistance of a cathode electrode 80 to be described below.

A bank 60 is formed on the anode electrode 40 and the auxiliary electrode 50 and defines a pixel area. An organic emission layer 70 is formed in the pixel area defined by the bank 60, and the cathode electrode 80 is formed on the organic emission layer 70.

In the top emission type, light emitted from the organic emission layer 70 travels through the cathode electrode 80. Therefore, the cathode electrode 80 is formed of a transparent conductive material, and for this reason, a resistance of the cathode electrode 80 increases. In order to decrease the resistance of the cathode electrode 80, the cathode electrode 80 is connected to the auxiliary electrode 50.

The gate insulation layer 12 and the interlayer dielectric 14 are formed in a pad area PA on the substrate 10, a signal pad 90 is formed on the interlayer dielectric 14, and the passivation layer 20 is formed on the signal pad 90. A hole is formed in the passivation layer 20, and the signal pad 90 is exposed to the outside through the hole. Since the signal pad 90 should be connected to an external driving circuit, the hole is formed in the passivation layer 20, and the signal pad 90 is exposed to the outside through the hole.

The related art top emission type organic light emitting display device has at least the following problems.

Since the signal pad 90 should be connected to the external driving circuit, a top of the signal pad 90 is exposed to the outside. For this reason, the top of the signal pad 90 is corroded, and the corrosion is spread to another area. In order to prevent the top of the signal pad 90 from being corroded, a metal layer which is good in corrosion resistance may be further formed on the top of the signal pad 90, but in this case, a separate process is additionally performed. Also, in order to prevent the top of the signal pad 90 from being corroded without the separate process being additionally performed, an electrode layer which is the same as the anode electrode 40 may be formed on the signal pad 90 through the same process, but in this case, it is unable to prevent corrosion from being made through a side of the electrode layer.

Moreover, in order to connect the signal pad 90 to the external driving circuit, the hole is formed in the passivation layer 20, and the top of the signal pad 90 is exposed through the hole. However, if the hole is previously formed in the passivation layer 20, an etchant for forming a pattern of the anode electrode 40 flows in through the hole to damage the signal pad 90. In order to prevent the damage, the hole of the passivation layer 20 for exposing the top of the signal pad 90 may be separately performed after a process of forming the pattern of the anode electrode 40 is completed, but in this case, a separate mask process is additionally performed.

SUMMARY OF THE INVENTION

Accordingly, the present invention is directed to provide a top emission type organic light emitting display device and a method of manufacturing the same that substantially obviate one or more problems due to limitations and disadvantages of the related art.

An aspect of the present invention is directed to provide a top emission type organic light emitting display device and a method of manufacturing the same, in which the number of additional processes is minimized, and a signal pad is prevented from being corroded.

In addition to the aforesaid objects of the present invention, other features and advantages of the present invention will be described below, but will be clearly understood by those skilled in the art from descriptions below.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an organic light emitting display device that includes a substrate including an active area and a pad area, a thin film transistor (TFT) in the active area of the substrate, the TFT including a gate electrode, an anode electrode on the TFT, an organic emission layer on the anode electrode, a cathode electrode on the organic emission layer, an auxiliary electrode connected to the cathode electrode and disposed on the same layer as the anode electrode, a signal pad in the pad area of the substrate, the signal pad being disposed on the same layer as the gate electrode, and a pad electrode connected to the signal pad to cover a top of the signal pad for preventing the top of the signal pad from being corroded.

In another aspect of the present invention, there is provided a method of manufacturing an organic light emitting display device which includes forming a thin film transistor (TFT) in an active area of a substrate and forming a signal pad and a first pad electrode, connected to the signal pad, in a pad area of the substrate, forming a passivation layer on the TFT and the first pad electrode, forming a planarization layer on the passivation layer, removing a certain region of the passivation layer to simultaneously form an area, through which the TFT is exposed to the outside, and an area through which the first pad electrode is exposed to the outside, forming a first anode electrode connected to the TFT, a first auxiliary electrode spaced apart from the first anode electrode, and a second pad electrode that is connected to the first pad electrode and covers the exposed first pad electrode, and forming a second anode electrode, covering a top and a side surface of the first anode electrode, and a second auxiliary electrode covering a top and a side surface of the first auxiliary electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE EMBODIMENTS

Figure 1:
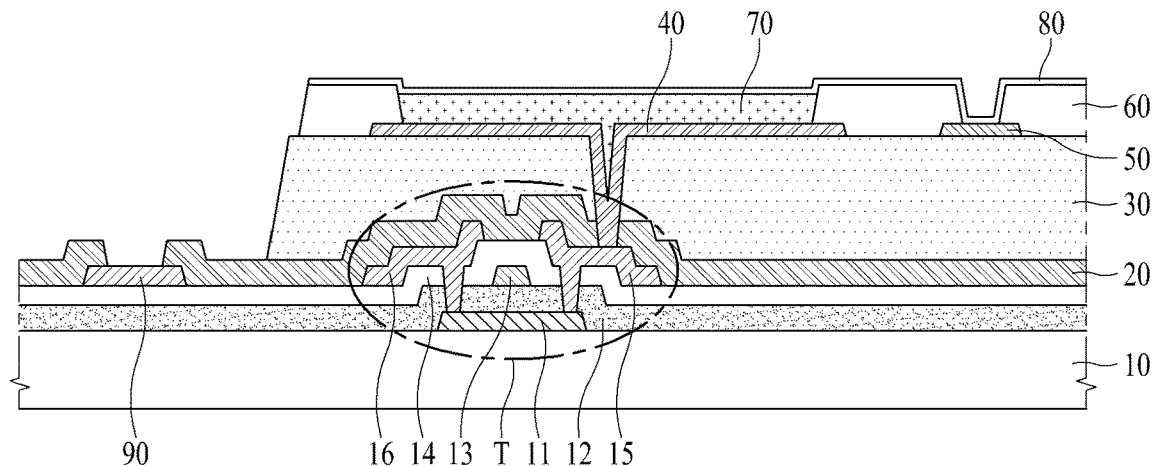
FIG. 1 is a schematic cross-sectional view of a related art organic light emitting display device.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, exemplary embodiments of the present invention will be described in detail with reference to the accompanying drawings.

Figure 2:
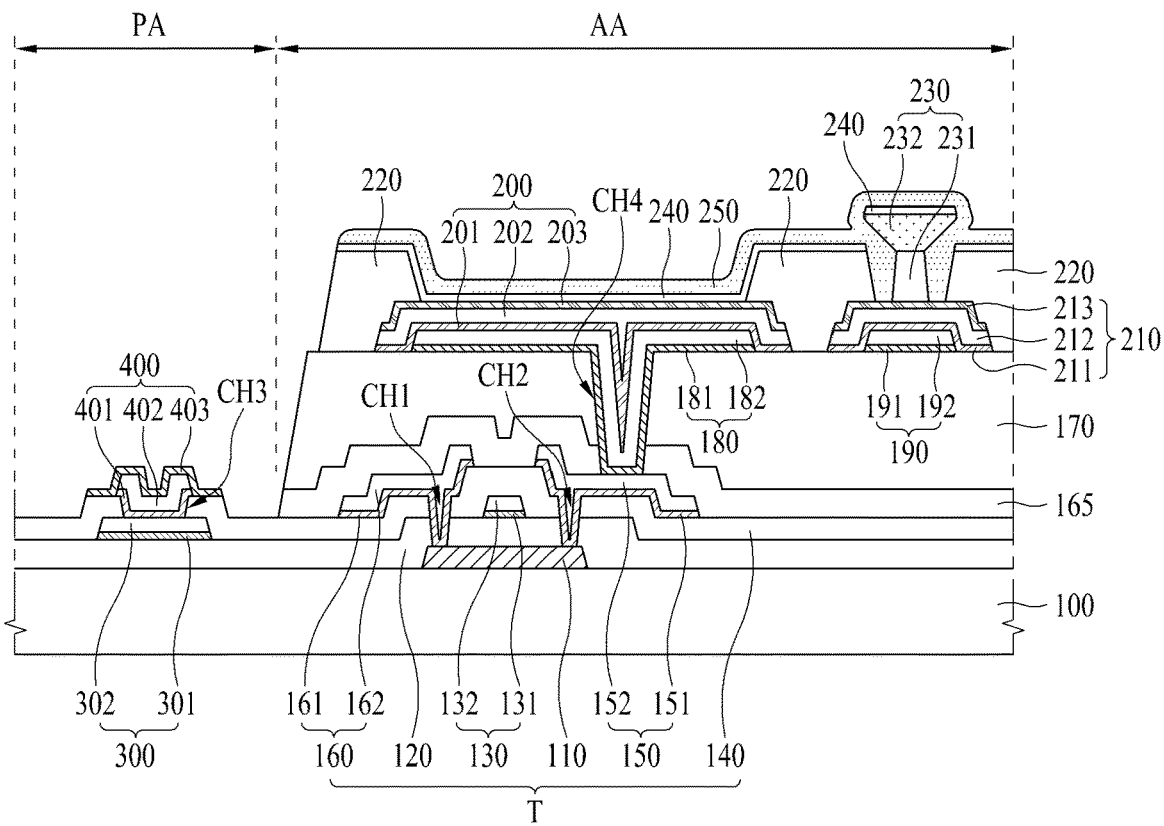
FIG. 2 is a schematic cross-sectional view of an organic light emitting display device according to an embodiment of the present invention.

FIG. 2 is a cross-sectional view of an organic light emitting display device 100 according to an embodiment of the present invention. All the components of the organic light emitting display device according to all embodiments of the present invention are operatively coupled and configured.

As seen in FIG. 2, the organic light emitting display device 100 according to an embodiment of the present invention may include an active area AA and a pad area PA which are provided on the substrate 100.

A thin film transistor (TFT) layer T, a passivation layer 165, a planarization layer 170, a first anode electrode 180, a second anode electrode 200, a first auxiliary electrode 190, a second auxiliary electrode 210, a bank 220, a partition wall 230, an organic emission layer 240, and a cathode electrode 250 may be formed in the active area AA on the substrate 100.

The TFT layer T may include an active layer 110, a gate insulation layer 120, a gate electrode 130, an interlayer dielectric 140, a source electrode 150, and a drain electrode 160.

The active layer 110 may be formed on the substrate 100 to overlap the gate electrode 130. The active layer 110 may be formed of a silicon-based semiconductor material, or may be formed of an oxide-based semiconductor material. A light shielding layer may be further formed between the substrate 100 and the active layer 110, and in this case, external light incident through a bottom of the substrate 100 is blocked by the light shielding layer, thereby preventing the active layer 110 from being damaged by the external light.

The gate insulation layer 120 may be formed on the active layer 110. The gate insulation layer 120 may insulate the active layer 110 from the gate electrode 130. The gate insulation layer 120 may be formed of an inorganic insulating material, for example, silicon oxide (SiOx), silicon nitride (SiNx), or a multilayer thereof, but is not limited thereto. The gate insulation layer 120 may extend to the pad area PA.

The gate electrode 130 may be formed on the gate insulation layer 120. The gate electrode 130 may be formed to overlap the active layer 110 with the gate insulation layer 120 therebetween. The gate electrode 130 may be formed of a single layer or a multilayer including one of molybdenum (Mo), aluminum (Al), chromium (Cr), gold (Au), titanium (Ti), nickel (Ni), neodymium (Nd), and copper (Cu) or an alloy thereof, but is not limited thereto.

The gate electrode 130 may include a lower gate electrode 131 and an upper gate electrode 132.

The lower gate electrode 131 may be formed between the gate insulation layer 120 and the upper gate electrode 132 to enhance an adhesive force between the gate insulation layer 120 and the upper gate electrode 132. Also, the lower gate electrode 131 prevents a bottom of the upper gate electrode 132 from being corroded. Therefore, an oxidation rate of the lower gate electrode 131 may be lower than that of the upper gate electrode 132. That is, the lower gate electrode 131 may be formed of a material which is stronger in corrosion resistance than a material included in the upper gate electrode 132. As described above, the lower gate electrode 131 may be formed of an alloy (MoTi) of Mo and Ti, but is not limited thereto.

The upper gate electrode 132 may be formed on a top of the lower gate electrode 131 and may be formed of copper (Cu), but is not limited thereto. In order to lower a total resistance of the gate electrode 130, a thickness of the upper gate electrode 132 may be formed thicker than that of the lower gate electrode 131.

The interlayer dielectric 140 may be formed on the gate electrode 130. The interlayer dielectric 140 may be formed of the same inorganic insulating material as that of the gate insulation layer 120, for example, may be formed of silicon oxide (SiOx), silicon nitride (SiNx), or a multilayer thereof, but is not limited thereto. The interlayer dielectric 140 may extend to the pad area PA.

The source electrode 150 and the drain electrode 160 may be formed to face each other on the interlayer dielectric 140. A first contact hole CH1 exposing one end region of the active layer 110 and a second contact hole CH2 exposing the other end region of the active layer 110 may be included in the gate insulation layer 120 and the interlayer dielectric 140. The source electrode 150 may be connected to the other end region of the active layer 110 through the second contact hole CH2, and the drain electrode 160 may be connected to the one end region of the active layer 110 through the first contact hole CH1.

The source electrode 150 may include a lower source electrode 151 and an upper source electrode 152.

The lower source electrode 151 may be formed between the interlayer dielectric 140 and the upper source electrode 152 to enhance an adhesive force between the interlayer dielectric 140 and the upper source electrode 152. Also, the lower source electrode 151 protects a bottom of the upper source electrode 152, thereby preventing the bottom of the upper source electrode 152 from being corroded. Therefore, an oxidation rate of the lower source electrode 151 may be lower than that of the upper source electrode 152. That is, the lower source electrode 151 may be formed of a material which is stronger in corrosion resistance than a material included in the upper source electrode 152. As described above, the lower source electrode 151 may act as an adhesion enhancement layer or an anti-corrosion layer and may be formed of an alloy (MoTi) of Mo and Ti, but is not limited thereto.

The upper source electrode 152 may be formed on a top of the lower source electrode 151. The upper source electrode 152 may be formed of Cu which is metal having a low resistance, but is not limited thereto. The upper source electrode 152 may be formed of metal which is relatively lower in resistance than the lower source electrode 151. In order to lower a total resistance of the source electrode 150, a thickness of the upper source electrode 152 may be formed thicker than that of the lower source electrode 151.

Similarly to the above-described source electrode 150, the drain electrode 160 may include a lower drain electrode 161 and an upper drain electrode 162.

The lower drain electrode 161 may be formed between the interlayer dielectric 140 and the upper drain electrode 162 to enhance an adhesive force between the interlayer dielectric 140 and the upper drain electrode 162 and prevent a bottom of the upper drain electrode 162 from being corroded. Therefore, an oxidation rate of the lower drain electrode 161 may be lower than that of the upper drain electrode 162. That is, the lower drain electrode 161 may be formed of a material which is stronger in corrosion resistance than a material included in the upper drain electrode 162. As described above, the lower drain electrode 161 may be formed of an alloy (MoTi) of Mo and Ti which is the same as the above-described material of the lower source electrode 151, but is not limited thereto.

The upper drain electrode 162 may be formed on a top of the lower drain electrode 161 and may be formed of Cu which is the same as the above-described material of the upper source electrode 152, but is not limited thereto. A thickness of the upper drain electrode 162 may be formed thicker than that of the lower drain electrode 161, thereby lowering a total resistance of the drain electrode 160.

The upper drain electrode 162 may be formed of the same material as that of the upper source electrode 152 to have the same thickness as that of the upper source electrode 152, and the lower drain electrode 161 may be formed of the same material as that of the lower source electrode 151 to have the same thickness as that of the lower source electrode 151. In this case, the drain electrode 160 and the source electrode 150 may be simultaneously formed through the same process.

A structure of the TFT T is not limited to the illustrated structure, and may be variously modified to structures known to those skilled in the art. For example, a top gate structure where the gate electrode 130 is formed on the active layer 110 is illustrated in the drawing, but the TFT T may be formed in a bottom gate structure where the gate electrode 130 is formed under the active layer 110.

The passivation layer 165 may be formed on the TFT layer T, and in more detail, may be formed on tops of the source electrode 150 and the drain electrode 160. The passivation layer 165 protects the TFT layer T. The passivation layer 165 may be formed of an inorganic insulating material (for example, SiOx and SiNx), but is not limited thereto. The passivation layer 165 may extend to the pad area PA.

The planarization layer 170 may be formed on the passivation layer 165. The planarization layer 170 may planarize an upper surface of the substrate 100 including the TFT layer T. The planarization layer 170 may be formed of an organic insulating material such as acryl resin, epoxy resin, phenolic resin, polyamide resin, polyimide resin, or the like, but is not limited thereto. The planarization layer 170 may not extend to the pad area PA.

The first anode electrode 180 and the first auxiliary electrode 190 may be formed on the planarization layer 170. That is, the first anode electrode 180 and the first auxiliary electrode 190 may be formed on the same layer. A fourth contact hole CH4 exposing the source electrode 150 may be included in the passivation layer 165 and the planarization layer 170, and the source electrode 150 may be connected to the first anode electrode 180 through the fourth contact hole CH4.

The first anode electrode 180 may include a first lower anode electrode 181 and a first upper anode electrode 182.

The first lower anode electrode 181 may be formed between the planarization layer 170 and the first upper anode electrode 182 to enhance an adhesive force between the planarization layer 170 and the first upper anode electrode 182. Also, the first lower anode electrode 181 protects a bottom of the first upper anode electrode 182, thereby preventing the bottom of the first upper anode electrode 182 from being corroded. Therefore, an oxidation rate of the first lower anode electrode 181 may be lower than that of the first upper anode electrode 182. That is, the first lower anode electrode 181 may be formed of a material which is stronger in corrosion resistance than a material included in the first upper anode electrode 182. Also, the first lower anode electrode 181 protects a top of the upper source electrode 152, thereby preventing the top of the upper source electrode 152 from being corroded. Therefore, an oxidation rate of the first lower anode electrode 181 may be lower than that of the upper source electrode 152. That is, the first lower anode electrode 181 may be formed of a material which is stronger in corrosion resistance than a material included in the upper source electrode 152. As described above, the first lower anode electrode 181 prevents the top of the upper source electrode 152 from being corroded, and thus, the source electrode 150 may be formed in the above-described two-layer structure. The first lower anode electrode 181 may act as an adhesion enhancement layer or an anti-corrosion layer and may be formed of an alloy (MoTi) of Mo and Ti, but is not limited thereto.

The first upper anode electrode 182 may be formed on a top of the first lower anode electrode 181. The first upper anode electrode 182 may be formed of Cu which is metal having a low resistance, but is not limited thereto. The first upper anode electrode 182 may be formed of metal which is relatively lower in resistance than the first lower anode electrode 181. In order to lower a total resistance of the first anode electrode 180, a thickness of the first upper anode electrode 182 may be formed thicker than that of the first lower anode electrode 181.

Similarly to the above-described first anode electrode 180, the first auxiliary electrode 190 may include a first lower auxiliary electrode 191 and a first upper auxiliary electrode 192.

The first lower auxiliary electrode 191 may be formed between the planarization layer 170 and the first upper auxiliary electrode 192 to enhance an adhesive force between the planarization layer 170 and the first upper auxiliary electrode 192 and prevent a bottom of the first upper auxiliary electrode 192 from being corroded. Therefore, an oxidation rate of the first lower auxiliary electrode 191 may be lower than that of the first upper auxiliary electrode 192. That is, the first lower auxiliary electrode 191 may be formed of a material which is stronger in corrosion resistance than a material included in the first upper auxiliary electrode 192. As described above, the first lower auxiliary electrode 191 may be formed of an alloy (MoTi) of Mo and Ti which is the same as the above-described material of the first lower anode electrode 181, but is not limited thereto.

The first upper auxiliary electrode 192 may be formed on a top of the first lower auxiliary electrode 191 and may be formed of Cu which is the same as the above-described material of the first upper anode electrode 182, but is not limited thereto. A thickness of the first upper auxiliary electrode 192 which is relatively low in resistance may be formed thicker than that of the first lower auxiliary electrode 191 which is relatively high in resistance, thereby lowering a total resistance of the first auxiliary electrode 190.

The first upper auxiliary electrode 192 may be formed of the same material as that of the first upper anode electrode 182 to have the same thickness as that of the first upper anode electrode 182, and the first lower auxiliary electrode 191 may be formed of the same material as that of the first lower anode electrode 181 to have the same thickness as that of the first lower anode electrode 181. In this case, the first auxiliary electrode 190 and the first anode electrode 180 may be simultaneously formed through the same process.

The second anode electrode 200 may be formed on a top of the first anode electrode 180. The second anode electrode 200 may be formed to contact the whole top and a whole side surface of the first anode electrode 180. That is, a separate insulation layer may not be formed between the second anode electrode 200 and the first anode electrode 180, and thus, a process of forming an insulation layer and a contact hole may be omitted. The second anode electrode 200 may reflect light, emitted from the organic emission layer 240, in an up direction and thus may include a material which is good in reflectivity. Also, the second anode electrode 200 may be formed to cover the top and the side surface of the first anode electrode 180, thereby preventing the top and the side surface of the first anode electrode 180 from being corroded.

The second anode electrode 200 may include a second lower anode electrode 201, a second center anode electrode 202, and a second upper anode electrode 203.

The second lower anode electrode 201 may be formed between the first anode electrode 180 and the second center anode electrode 202. The second lower anode electrode 201 may be formed to cover the top and the side surface of the first anode electrode 180, thereby preventing the first anode electrode 180 from being corroded. To this end, an oxidation rate of the second lower anode electrode 201 may be lower than that of each of the first lower anode electrode 181 and the first upper anode electrode 182 which configure the first anode electrode 180. That is, the second lower anode electrode 201 may be formed of a material which is stronger in corrosion resistance than a material included in each of the first lower anode electrode 181 and the first upper anode electrode 182. Also, the second lower anode electrode 201 protects a bottom of the second center anode electrode 202, thereby preventing the bottom of the second center anode electrode 202 from being corroded. Therefore, an oxidation rate of the second lower anode electrode 201 may be lower than that of the second center anode electrode 202. That is, the second lower anode electrode 201 may be formed of a material which is stronger in corrosion resistance than a material included in the second center anode electrode 202. The second lower anode electrode 201 may be formed of a transparent conductive material such as indium tin oxide (ITO) or the like, but is not limited thereto.

The second center anode electrode 202 may be formed between the second lower anode electrode 201 and the second upper anode electrode 203. The second center anode electrode 202 may be formed of a material which is lower in resistance than and better in reflectivity than the second lower anode electrode 201 and the second upper anode electrode 203, and for example, may be formed of silver (Ag) and/or the like. However, the present embodiment is not limited thereto. A thickness of the second center anode electrode 202 which is relatively low in resistance may be formed thicker than that of each of the second lower anode electrode 201 and the second upper anode electrode 203 which are relatively high in resistance, thereby lowering a total resistance of the second anode electrode 200.

The second upper anode electrode 203 may be formed on a top of the second center anode electrode 202, thereby preventing the top of the second center anode electrode 202 from being corroded. To this end, an oxidation rate of the second upper anode electrode 203 may be lower than that of the second center anode electrode 202. That is, the second upper anode electrode 203 may be formed of a material which is stronger in corrosion resistance than a material included in the second center anode electrode 202. The second upper anode electrode 203 may be formed of a transparent conductive material such as ITO or the like, but is not limited thereto.

The second auxiliary electrode 210 may be formed on a top of the first auxiliary electrode 190. The second auxiliary electrode 210 may be formed on the same layer as that of the second anode electrode 200. The second auxiliary electrode 210 may be formed to contact the whole top and a whole side surface of the first auxiliary electrode 190. That is, a separate insulation layer may not be formed between the second auxiliary electrode 210 and the first auxiliary electrode 190, and thus, a process of forming an insulation layer and a contact hole may be omitted. The second auxiliary electrode 210 may lower a resistance of the cathode electrode 250 along with the first auxiliary electrode 190. According to an embodiment of the present invention, in order to lower a resistance of the cathode electrode 250, two auxiliary electrodes (e.g., the first auxiliary electrode 190 and the second auxiliary electrode 210) may be stacked, and thus, the desired resistance characteristics of the auxiliary electrodes are more easily adjusted. Also, the second auxiliary electrode 210 may be formed to cover the top and the side surface of the first auxiliary electrode 190, thereby preventing the top and the side surface of the first auxiliary electrode 190 from being corroded.

The second auxiliary electrode 210 may include a second lower auxiliary electrode 211, a second center auxiliary electrode 212, and a second upper auxiliary electrode 213.

The second lower auxiliary electrode 211 may be formed between the first auxiliary electrode 190 and the second center auxiliary electrode 212. The second lower auxiliary electrode 211 may be formed to cover the top and the side surface of the first auxiliary electrode 190, thereby preventing the first auxiliary electrode 190 from being corroded. To this end, an oxidation rate of the second lower auxiliary electrode 211 may be lower than that of each of the first lower auxiliary electrode 191 and the first upper auxiliary electrode 192 which configure the first auxiliary electrode 190. That is, the second lower auxiliary electrode 211 may be formed of a material which is stronger in corrosion resistance than a material included in each of the first lower auxiliary electrode 191 and the first upper auxiliary electrode 192. Also, the second lower auxiliary electrode 211 protects a bottom of the second center auxiliary electrode 212, thereby preventing the bottom of the second center auxiliary electrode 212 from being corroded. Therefore, an oxidation rate of the second lower auxiliary electrode 211 may be lower than that of the second center auxiliary electrode 212. That is, the second lower auxiliary electrode 211 may be formed of a material which is stronger in corrosion resistance than a material included in the second center auxiliary electrode 212. The second lower auxiliary electrode 211 may be formed of a transparent conductive material such as indium tin oxide (ITO) or the like, but is not limited thereto.

The second center auxiliary electrode 212 may be formed between the second lower auxiliary electrode 211 and the second upper auxiliary electrode 213. The second center auxiliary electrode 212 may be formed of a material which is lower in resistance than and better in reflectivity than the second lower auxiliary electrode 211 and the second upper auxiliary electrode 213, and for example, may be formed of silver (Ag) and/or the like. However, the present embodiment is not limited thereto. A thickness of the second center auxiliary electrode 212 which is relatively low in resistance may be formed thicker than that of each of the second lower auxiliary electrode 211 and the second upper auxiliary electrode 213 which are relatively high in resistance, thereby lowering a total resistance of the second auxiliary electrode 210.

The second upper auxiliary electrode 213 may be formed on a top of the second center auxiliary electrode 212, thereby preventing the top of the second center auxiliary electrode 212 from being corroded. To this end, an oxidation rate of the second upper auxiliary electrode 213 may be lower than that of the second center auxiliary electrode 212. That is, the second upper auxiliary electrode 213 may be formed of a material which is stronger in corrosion resistance than a material included in the second center auxiliary electrode 212. The second upper auxiliary electrode 213 may be formed of a transparent conductive material such as ITO or the like, but is not limited thereto.

The second upper auxiliary electrode 213 may be formed of the same material as that of the second upper anode electrode 203 to have the same thickness as that of the second upper anode electrode 203, the second center auxiliary electrode 212 may be formed of the same material as that of the second center anode electrode 202 to have the same thickness as that of the second center anode electrode 202, and the second lower auxiliary electrode 211 may be formed of the same material as that of the second lower anode electrode 201 to have the same thickness as that of the second lower anode electrode 201. In this case, the second auxiliary electrode 210 and the second anode electrode 200 may be simultaneously formed through the same process.

The bank 220 may be formed on the second anode electrode 200 and the second auxiliary electrode 210.

The bank 220 may be formed on each of one side and the other side of the second anode electrode 200 to expose a top of the second anode electrode 200. Since the bank 220 is formed to expose the top of the second anode electrode 200, an area where an image is displayed is secured. Also, since the bank 220 is formed on each of the one side and the other side of the second anode electrode 200, a side surface of the second center anode electrode 202 vulnerable to corrosion is prevented from being exposed to the outside, thereby preventing the side surface of the second center anode electrode 202 from being corroded.

The bank 220 may be formed on each of one side and the other side of the second auxiliary electrode 210 to expose a top of the second auxiliary electrode 210. Since the bank 220 is formed to expose the top of the second auxiliary electrode 210, an electrical connection space between the second auxiliary electrode 210 and the cathode electrode 250 is secured. Also, since the bank 220 is formed on each of the one side and the other side of the second auxiliary electrode 210, a side surface of the second center auxiliary electrode 212 vulnerable to corrosion is prevented from being exposed to the outside, thereby preventing the side surface of the second center auxiliary electrode 212 from being corroded.

Moreover, the bank 220 may be formed between the second anode electrode 200 and the second auxiliary electrode 210 to insulate the second anode electrode 200 from the second auxiliary electrode 210. The bank 220 may be formed of an organic insulating material such as polyimide resin, acryl resin, benzocyclobutene (BCB), or the like, but is not limited thereto.

The partition wall 230 may be formed on the second auxiliary electrode 210. The partition wall 230 may be spaced apart from the bank 220 by a certain distance, and the second auxiliary electrode 210 may be electrically connected to the cathode electrode 250 through a separation space between the partition wall 230 and the bank 220. The second auxiliary electrode 210 may be electrically connected to the cathode electrode 250 without forming the partition wall 230. However, if the partition wall 230 is formed, the organic emission layer 240 is more easily deposition-formed. This will be described below in more detail.

If the partition wall 230 is not formed, a mask pattern which covers a top of the second auxiliary electrode 210 is needed in depositing the organic emission layer 240, in order for the top of the second auxiliary electrode 210 not to be covered by the organic emission layer 240. However, if the partition wall 230 is formed, a top of the partition wall 230 may act like eaves in depositing the organic emission layer 240, and thus, since the organic emission layer 240 is not deposited under the eaves, the mask pattern which covers the top of the second auxiliary electrode 210 is not needed. That is, with respect to a case where the organic light emitting display device is seen from the front thereof, when the top of the partition wall 230 that acts as eaves is formed to cover a separation space between the partition wall 230 and the bank 220, the organic emission layer 240 cannot penetrate into the separation space between the partition wall 230 and the bank 220, and thus, the second auxiliary electrode 210 may be exposed in the separation space between the partition wall 230 and the bank 220. Particularly, the organic emission layer 240 may be formed by a deposition process such as an evaporation process which is excellent in straightness of a deposited material, and thus, the organic emission layer 240 is not deposited in the separation space between the partition wall 230 and the bank 220 in a process of depositing the organic emission layer 240.

As described above, a width of the top of the partition wall 230 may be formed greater than that of a bottom of the partition wall 230, in order for the top of the partition wall 230 to act as the eaves. The partition wall 230 may include a lower first partition wall 231 and an upper second partition wall 232. The first partition wall 231 may be formed on a top of the second auxiliary electrode 210 and may be formed of the same material as that of the bank 220 through the same process as that of the bank 220. The second partition wall 232 may be formed on a top of the first partition wall 231. A width of a top of the second partition wall 232 may be formed greater than that of a bottom of the second partition wall 232, and particularly, the top of the second partition wall 232 may be formed to cover the separation space between the partition wall 230 and the bank 220 and may act as eaves.

The organic emission layer 240 may be formed on the second anode electrode 200. The organic emission layer 240 may include a hole injection layer, a hole transport layer, an emission layer, an electron transport layer, and an electron injection layer. The organic emission layer 240 may be modified to have various structures known to those skilled in the art.

The organic emission layer 240 may extend to the top of the bank 220. However, the organic emission layer 240 may not extend to the top of the second auxiliary electrode 210 in a state of covering the top of the second auxiliary electrode 210. This is because when the organic emission layer 240 covers the top of the second auxiliary electrode 210, it is difficult to electrically connect the second auxiliary electrode 210 to the cathode electrode 250. As described above, the organic emission layer 240 may be formed by a deposition process without a mask that covers the top of the second auxiliary electrode 210, and in this case, the organic emission layer 240 may be formed on the top of the partition wall 230.

The cathode electrode 250 may be formed on the organic emission layer 240. The cathode electrode 250 may be formed on a surface from which light is emitted, and thus may be formed of a transparent conductive material. Since the cathode electrode 250 is formed of a transparent conductive material, a resistance of the cathode electrode 250 is high, and for this reason, in order to lower the resistance of the cathode electrode 250, the cathode electrode 250 may be connected to the second auxiliary electrode 210. That is, the cathode electrode 250 may be connected to the second auxiliary electrode 210 through the separation space between the partition wall 230 and the bank 220. The cathode electrode 250 may be formed by a deposition process such as a sputtering process which is not good in straightness of a deposited material, and thus, the cathode electrode 250 may be deposited in the separation space between the partition wall 230 and the bank 220 in a process of depositing the cathode electrode 250.

An encapsulation layer may be further formed on the cathode electrode 250 and prevents penetration of water. The encapsulation layer may use various materials known to those skilled in the art. Also, a color filter may be further formed for each pixel and on the cathode electrode 250, and in this case, white light may be emitted from the organic emission layer 240.

The gate insulation layer 120, the interlayer dielectric 140, a signal pad 300, and a pad electrode 400 may be formed in the pad area PA of the substrate 100.

The gate insulation layer 120 may be formed on the substrate 100. The interlayer dielectric 140 extend from the active area AA and may be formed all over the pad area PA.

The signal pad 300 may be formed on the gate insulation layer 120. The signal pad 300 may be formed on the same layer as that of the gate electrode 130 disposed in the active area AA.

The signal pad 300 may include a lower signal pad 301 and an upper signal pad 302.

The lower signal pad 301 may be formed between the gate insulation layer 120 and the upper signal pad 302 to enhance an adhesive force between the gate insulation layer 120 and the upper signal pad 302. Also, the lower signal pad 301 prevents a bottom of the upper signal pad 302 from being corroded. Therefore, an oxidation rate of the lower signal pad 301 may be lower than that of the upper signal pad 302. That is, the lower signal pad 301 may be formed of a material which is stronger in corrosion resistance than a material included in the upper signal pad 302. As described above, the lower signal pad 301 may be formed of an alloy (MoTi) of Mo and Ti which is the same as the above-described material of the lower gate electrode 131, but is not limited thereto.

The upper signal pad 302 may be formed on a top of the lower signal pad 301. The upper signal pad 302 may be formed of Cu which is metal having a low resistance, but is not limited thereto. The upper signal pad 302 may be formed of metal which is relatively lower in resistance than the lower signal pad 301. In order to lower a total resistance of the signal pad 300, a thickness of the upper signal pad 302 may be formed thicker than that of the lower signal pad 301.

The upper signal pad 302 may be formed of the same material as that of the upper gate electrode 132 to have the same thickness as that of the upper gate electrode 132, and the lower signal pad 301 may be formed of the same material as that of the lower gate electrode 131 to have the same thickness as that of the lower gate electrode 131. In this case, the signal pad 300 and the gate electrode 130 and/or the drain electrode 160 may be simultaneously formed through the same process.

The interlayer dielectric 140 may be formed on the signal pad 300. The interlayer dielectric 140 may extend from the active area AA. A third contact hole CH3 exposing a portion of the signal pad 300 may be included in the interlayer dielectric 140.

The interlayer dielectric 140 may be formed to expose a top of the signal pad 300 and cover a side surface of the signal pad 300. Since the interlayer dielectric 140 is formed to expose the top of the signal pad 300, the interlayer dielectric 140 may be connected to the below-described pad electrode 400. Also, the interlayer dielectric 140 may be formed on each of one side and the other side of the signal pad 300, and thus, the side surface of the upper signal pad 302 vulnerable to corrosion is not exposed to the outside, thereby preventing the side surface of the upper signal pad 302 from being corroded.

The pad electrode 400 may be formed on the interlayer dielectric 140. The pad electrode 400 may be connected to the signal pad 300 through the third contact hole CH3. The pad electrode 400 may be exposed to the outside and connected to an external driver.

The pad electrode 400 may include a lower pad electrode 401, an upper pad electrode 402, and a cover pad electrode 403.

The lower pad electrode 401 may be formed to cover a top of the upper signal pad 302 through the third contact hole CH3, thereby preventing the upper signal pad 302 from being corroded. To this end, an oxidation rate of the lower pad electrode 401 may be lower than that of the upper signal pad 302. That is, the lower pad electrode 401 may be formed of a material which is stronger in corrosion resistance than a material included in the upper signal pad 302. As described above, the lower pad electrode 401 prevents the top of the upper signal pad 302 from being corroded, and thus, the signal pad 300 may be formed in the above-described two-layer structure. An oxidation rate of the lower pad electrode 401 may be lower than that of the upper pad electrode 402. The lower pad electrode 401 may be formed of an alloy (MoTi) of Mo and Ti which is the same as the above-described material of the lower source electrode 151 and/or the lower drain electrode 161, but is not limited thereto. The lower pad electrode 401 may be formed of the same material as that of the lower source electrode 151 and/or the lower drain electrode 161 to have the same thickness as that of the lower source electrode 151 and/or the lower drain electrode 161, and in this case, the lower pad electrode 401 and the lower source electrode 151 and/or the lower drain electrode 161 may be pattern-formed through the same mask process.

The upper pad electrode 402 may be formed between the lower pad electrode 401 and the cover pad electrode 403. The upper pad electrode 402 may be formed of Cu which is metal having a low resistance, but is not limited thereto. The upper pad electrode 402 may be formed of metal which is relatively lower in resistance than the lower pad electrode 401 and the cover pad electrode 403. In order to lower a total resistance of the pad electrode 400, a thickness of the upper pad electrode 402 may be formed thicker than that of each of the lower pad electrode 401 and the cover pad electrode 403. The upper pad electrode 402 may be formed of the same material as that of the upper source electrode 152 and/or the upper drain electrode 162 to have the same thickness as that of the first upper anode electrode 182 and/or the first upper auxiliary electrode 192, and in this case, the upper pad electrode 402 and the upper source electrode 152 and/or the upper drain electrode 162 may be pattern-formed through the same mask process.

The cover pad electrode 403 may be formed on the upper pad electrode 402. The cover pad electrode 403 may be formed to cover a top and a side surface of the upper pad electrode 402, thereby preventing the upper pad electrode 402 from being corroded. That is, the cover pad electrode 403 prevents the upper pad electrode 402 from being exposed to the outside. To this end, an oxidation rate of the cover pad electrode 403 may be lower than that of the upper pad electrode 402. That is, the cover pad electrode 403 may be formed of a material which is stronger in corrosion resistance than a material forming the upper pad electrode 402.

The cover pad electrode 403 may cover up to a side surface of the lower pad electrode 401. In this case, an oxidation rate of the cover pad electrode 403 may be lower than that of the lower pad electrode 401. That is, the cover pad electrode 403 may be formed of a material which is stronger in corrosion resistance than a material included in the lower pad electrode 401. The cover pad electrode 403 may be formed of an alloy (MoTi) of Mo and Ti, but is not limited thereto. The cover pad electrode 403 may be formed of the same material as that of the first lower anode electrode 181 and/or the first lower auxiliary electrode 191 to have the same thickness as that of the first lower anode electrode 181 and/or the first lower auxiliary electrode 191, and in this case, the cover pad electrode 403 and the first lower anode electrode 181 and/or the first lower auxiliary electrode 191 may be pattern-formed through the same mask process.

FIGS. 3A to 3J are process cross-sectional views illustrating a method of manufacturing an organic light emitting display device according to an embodiment of the present invention and relate to a method of manufacturing the above-described organic light emitting display device of FIG. 2. Thus, like reference numerals refer to like elements, and in a material and a structure of each element, the same or similar descriptions may not be repeated or may be brief.

Figure 3A:
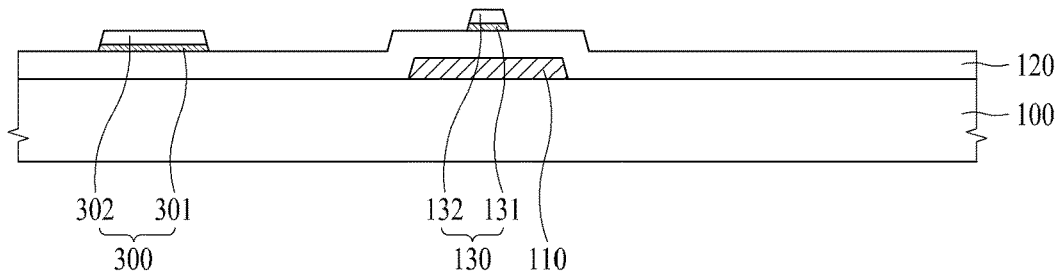
FIGS. 3A to 3J are process cross-sectional views illustrating a method of manufacturing an organic light emitting display device according to an embodiment of the present invention.

First, as seen in FIG. 3A, an active layer 110, a gate insulation layer 120, a gate electrode 130, and a signal pad 300 may be sequentially formed on a substrate 100.

To provide a more detailed description, the active layer 110 may be formed on the substrate 100, the gate insulation layer 120 may be formed on the active layer 110, the gate electrode 130 may be formed on the gate insulation layer 120, and the signal pad 300 may be formed.

Here, the active layer 110 and the gate electrode 130 may be formed in an active area AA, the gate insulation layer 120 may be formed to extend from the active area AA to a pad area PA, and the signal pad 300 may be formed in the pad area AA.

The gate electrode 130 may be configured with a lower gate electrode 131 and an upper gate electrode 132, and the signal pad 300 may be configured with a lower signal pad 301 and an upper signal pad 302. The gate electrode 130 and the signal pad 300 may be simultaneously formed of the same material by the same patterning process.

Figure 3B:
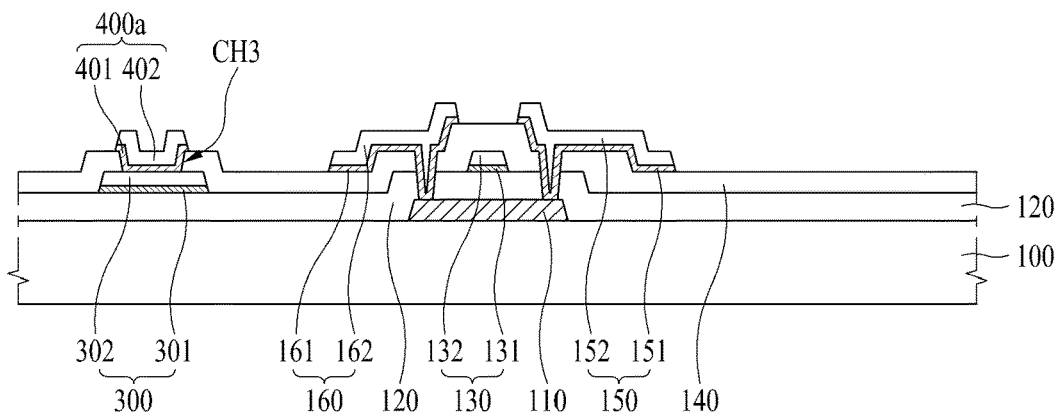

Subsequently, as seen in FIG. 3B, a interlayer dielectric 140 may be formed on the gate electrode 130, and a first contact hole CH1 and a second contact hole CH2 may be formed in the gate insulation layer 120 and the interlayer dielectric 140. Subsequently, a third contact hole CH3 may be in a drain electrode connected to one end region of the active layer 110 through the first contact hole CH1, a source electrode 150 connected to the other end region of the active layer 110 through the second contact hole CH2, and the interlayer dielectric 140, and a first pad electrode 400a may be formed to be connected to the signal pad 300 through the third contact hole CH3.

Here, the source electrode 150 and the drain electrode 160 may be formed in the active area AA, and the interlayer dielectric 140 may be formed to extend from the active area AA to the pad area PA, and the first pad electrode 400a may be formed in the pad area PA. Through such a process, a TFT layer T may be formed in the active area AA.

The source electrode 150 may include a lower source electrode 151 and an upper source electrode 152, the drain electrode 160 may include a lower drain electrode 161 and an upper drain electrode 162, and the first pad electrode 400a may include a first lower pad electrode 401 and a first upper pad electrode 402. The source electrode 150, the drain electrode 160, and the first pad electrode 400a may be simultaneously formed of the same material through the same patterning process.

Figure 3C:
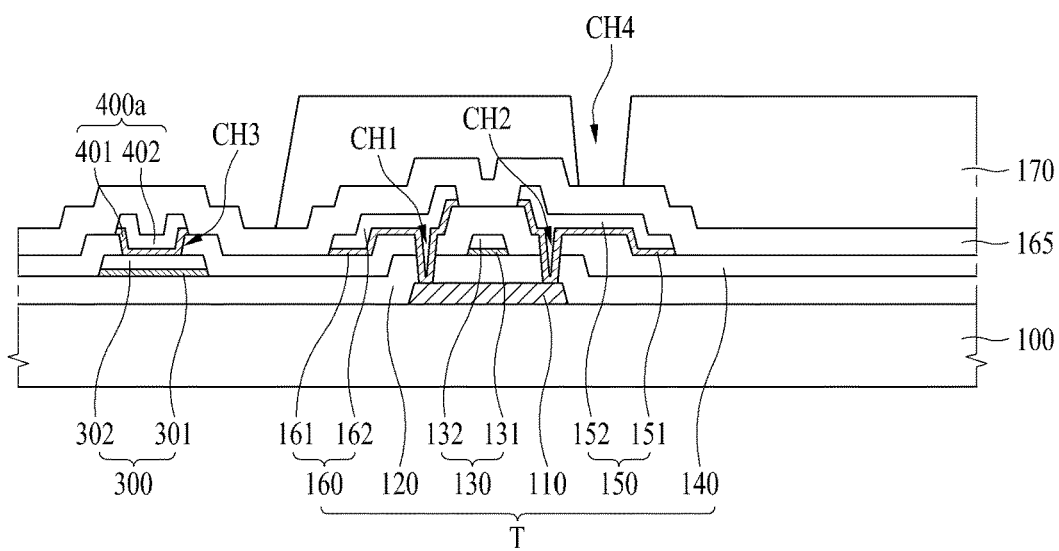

Subsequently, as seen in FIG. 3C, a passivation layer 165 may be formed on the source electrode 150, the drain electrode 160, and the first pad electrode 400a, and a planarization layer 170 may be formed on the passivation layer 165. The planarization layer 170 may include a fourth contact hole CH4.

The passivation layer 165 may be formed to extend from the active area AA to the pad area PA, and the planarization layer 170 may be formed in the active area AA. Since a TFT is not formed in the pad area PA, the necessity to planarize a surface thereof is small, and thus, the planarization layer 170 may not be formed in the pad area PA.

Figure 3D:
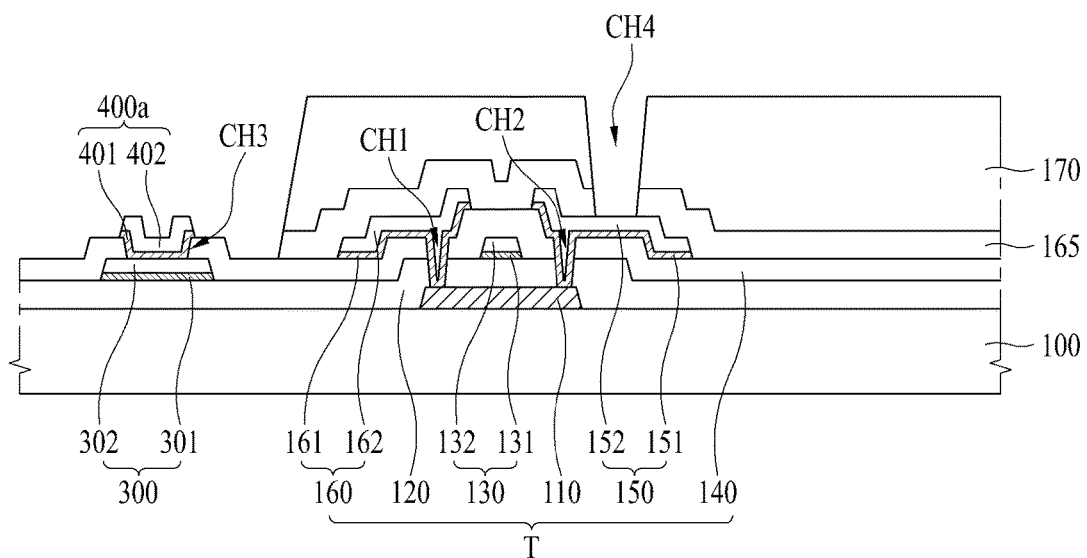

Subsequently, as seen in FIG. 3D, the fourth contact hole CH4 may be formed in the passivation layer 165, and by removing a certain region of the passivation layer 165 in the pad area PA, the first pad electrode 400a may be exposed to the outside. The source electrode 150 may be exposed to the outside through the fourth contact hole CH4 included in the passivation layer 165 and the planarization layer 170.

According to an embodiment of the present invention, a process of forming the fourth contact hole CH4 of the passivation layer 165 for exposing the source electrode 150 to the outside and a process of removing a certain region of the passivation layer 165 in the pad area PA for exposing the first pad electrode 400a to the outside may be simultaneously performed, and thus, by using one mask process, the fourth contact hole CH4 may be formed and the certain region of the passivation layer 165 may be removed, whereby the number of mask processes does not increase. To provide a more detailed description on this, since the first upper pad electrode 402 is vulnerable to corrosion, an etchant should not be brought in contact with the first upper pad electrode 402. According to an embodiment of the present invention, the exposed first upper pad electrode 402 may be covered by a second pad electrode 400b in a process of FIG. 3E to be described below, and thus, the etchant cannot be brought in contact with the first upper pad electrode 402. For the same reason as this, the process of forming the fourth contact hole CH4 and the process of removing the certain region of the passivation layer 165 may be simultaneously performed.

Figure 3E:
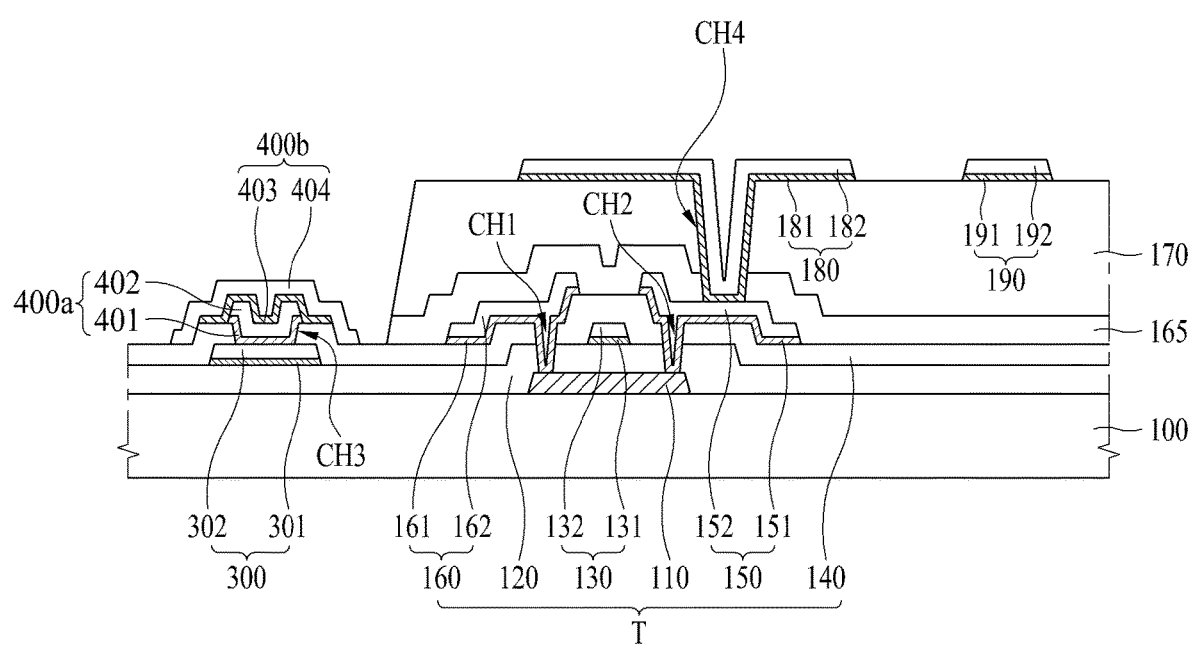

Subsequently, as seen in FIG. 3E, a first anode electrode 180 and a first auxiliary electrode 190 may be formed to be spaced apart from each other on the planarization layer 170 in the active area AA, and the second pad electrode 400b may be formed on the first pad electrode 400a in the pad area PA.

The first anode electrode 180 may be formed to be connected to the source electrode 150 through the fourth contact hole CH4, and the second pad electrode 400b may be formed to cover a top and a side surface of the first pad electrode 400a.

The first anode electrode 180 may be configured with a first lower anode electrode 181 and a first upper anode electrode 182. The first auxiliary electrode 190 may be configured with a first lower auxiliary electrode 191 and a first upper auxiliary electrode 192. The second pad electrode 400b may be configured with a second lower pad electrode 403 and a second upper pad electrode 404.

The first anode electrode 180, the first auxiliary electrode 190, and the second pad electrode 400b may be simultaneously formed of the same material through the same patterning process.

Figure 3F:
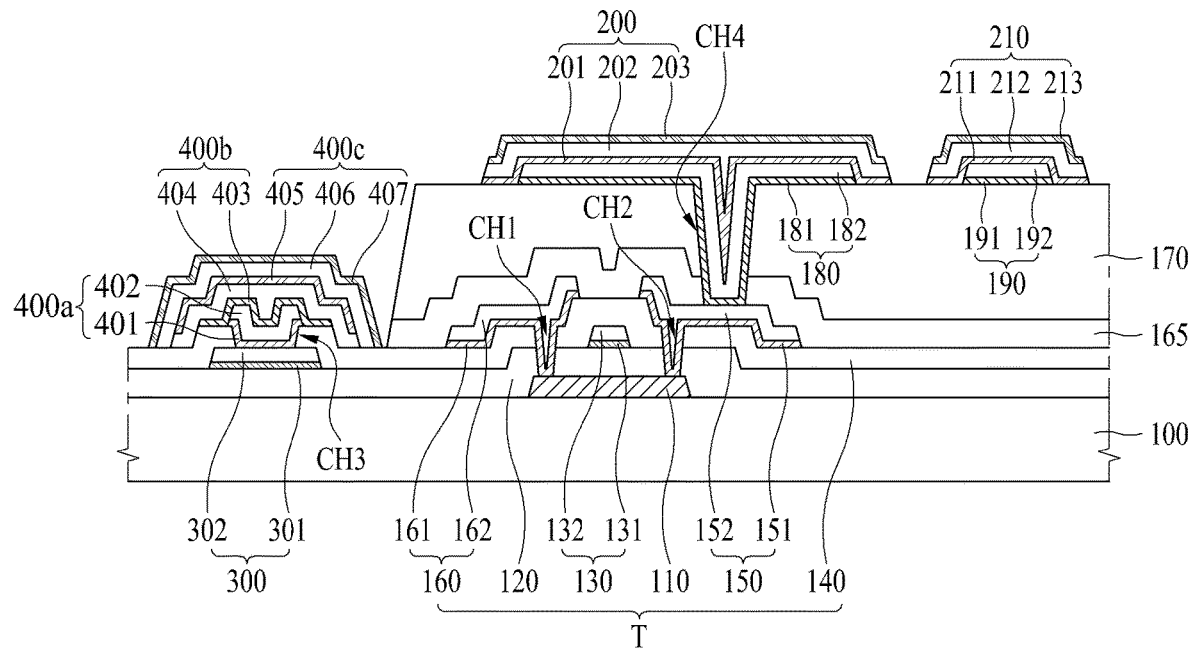

Subsequently, as seen in FIG. 3F, a second anode electrode 200 may be formed on the first anode electrode 180 in the active area AA, a second auxiliary electrode 210 may be formed on the first auxiliary electrode 190 in the active area AA, and a third pad electrode 400c may be formed on the second pad electrode 400b.

The second anode electrode 200 may be pattern-formed to cover a top and a side surface of the first anode electrode 180, and the second auxiliary electrode 210 may be pattern-formed to cover a top and a side surface of the first auxiliary electrode 190. The third pad electrode 400c may be pattern-formed to cover a top and a side surface of the second pad electrode 400b.

The second anode electrode 200, the second auxiliary electrode 210, and the third pad electrode 400c may be simultaneously formed of the same material through the same patterning process.

The second anode electrode 200 may include a second lower anode electrode 201, a second center anode electrode 202, and a second upper anode electrode 203. The second auxiliary electrode 210 may include a second lower auxiliary electrode 211, a second center auxiliary electrode 212, and a second upper auxiliary electrode 213. The third pad electrode 400c may include a third lower pad electrode 405, a third center pad electrode 406, and a third upper pad electrode 407.

Figure 3G:
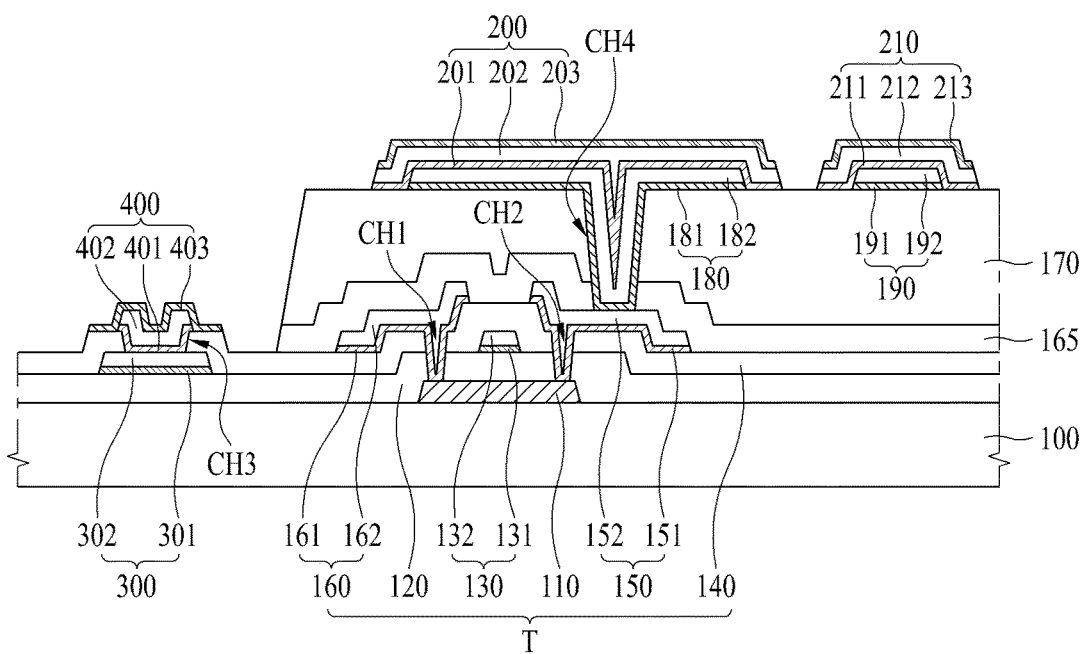

Subsequently, as seen in FIG. 3G, a process of pattern-forming the second anode electrode 200 and the second auxiliary electrode 210 may include an etching process based on an etchant, and in the etching process, the second upper pad electrode 404 and the third pad electrode 400c which are disposed in the pad area PA may be etched together. That is, in a process of pattern-forming the second anode electrode 200 and the second auxiliary electrode 210, by removing the second upper pad electrode 404 and the third pad electrode 400c, the pad electrode 400 which includes only the first pad electrode 400a and the second lower pad electrode 403 may be finished.

A photoresist pattern may be formed on the third pad electrode 400c, the planarization layer 170, the second anode electrode 200, and the second auxiliary electrode 210 through a half-tone mask process, and by ashing the photoresist pattern, a process of removing the third pad electrode 400c and the second upper pad electrode 404 and a process of pattern-forming the second anode electrode 200 and the second auxiliary electrode 210 may be simultaneously performed without performing a process illustrated in FIG. 3F. In this case, a photoresist pattern formed on the third pad electrode 400c and the second upper pad electrode 404 may be thin, and a photoresist pattern formed on the second anode electrode 200 and the second auxiliary electrode 210 may be thick, whereby the third pad electrode 400c and the second upper pad electrode 404 may be removed and the second anode electrode 200 and the second auxiliary electrode 210 may remain. The process of removing the third pad electrode 400c and the second upper pad electrode 404 is not limited thereto, and various manufacturing methods may be performed.

Figure 3H:
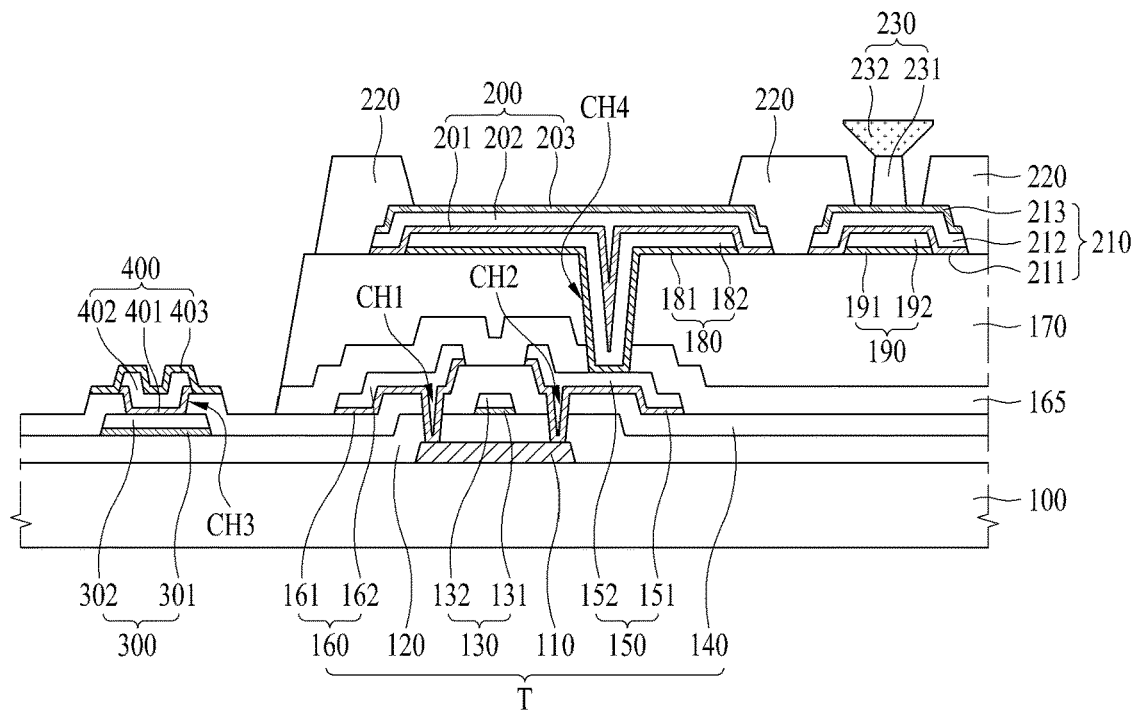

Subsequently, as seen in FIG. 3H, a bank 220 may be formed on each of one side and the other side of the second anode electrode 200 to expose a top of the second anode electrode 200, and moreover, the bank 220 may be formed on each of one side and the other side of the second auxiliary electrode 210 to expose a top of the second auxiliary electrode 210

Moreover, a first partition wall 231 and a second partition wall 232 may be sequentially formed on the exposed top of the second auxiliary electrode 210. The first partition wall 231 and the bank 220 may be simultaneously formed of the same material through the same patterning process. The partition wall 230 may be disposed to be spaced apart from the bank 220 by a certain distance, and thus, a separation space may be provided between the partition wall 230 and the bank 220.

In order for a top of the partition wall 230 to act as eaves, a width of a top of the second partition wall 232 may be adjusted to greater than that of a bottom of the second partition wall 232. Particularly, with respect to a case where the organic light emitting display device is seen from the front thereof, the top of the second partition wall 232 may cover the separation space between the partition wall 230 and the bank 220, and thus, in a process of depositing an organic emission layer 240 to be described below, the organic emission layer 240 cannot be deposited in the separation space between the partition wall 230 and the bank 220.

Figure 3I:
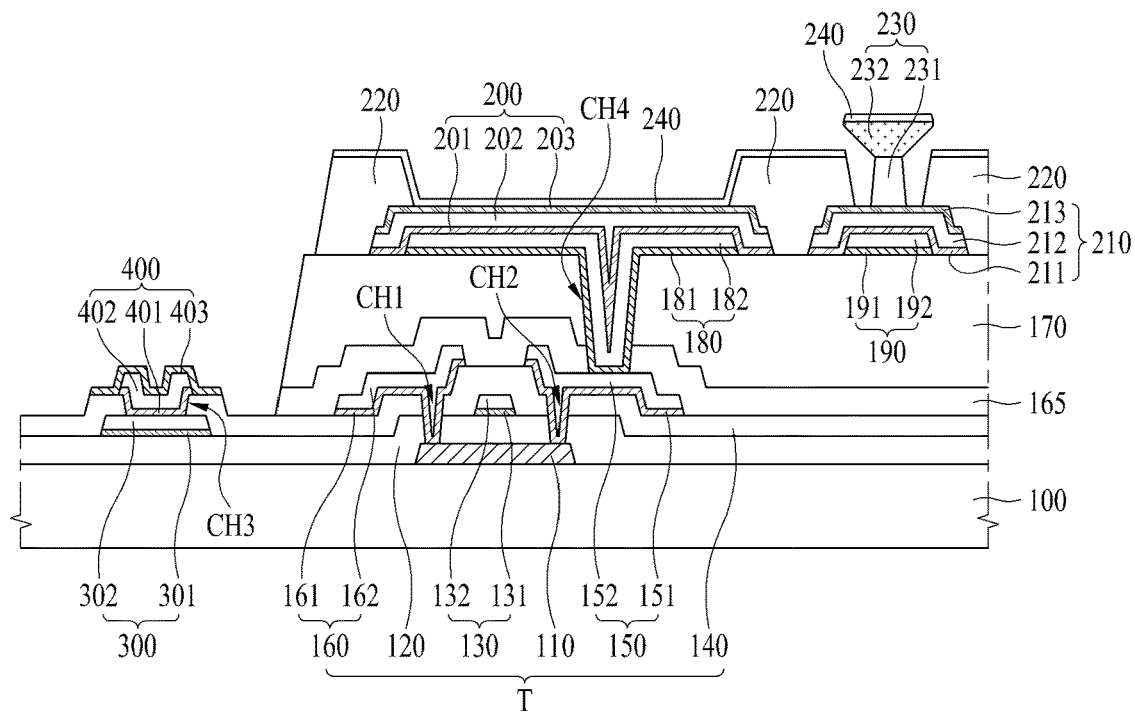

Subsequently, as seen in FIG. 3I, the organic emission layer 240 may be formed on the second anode electrode 200. The organic emission layer 240 may be formed by a deposition process such as an evaporation process which is excellent in straightness of a deposited material, and thus, the organic emission layer 240 is not deposited in the separation space between the partition wall 230 and the bank 220 although the organic emission layer 240 is deposited on the bank 220 and the top of the partition wall 230. That is, since the top of the partition wall 230 may act like eaves in depositing the organic emission layer 240, the organic emission layer 240 cannot be deposited in the separation space between the partition wall 230 and the bank 220 even when the organic emission layer 240 is deposited without a mask pattern covering the top of the second auxiliary electrode 210.

Figure 3J:
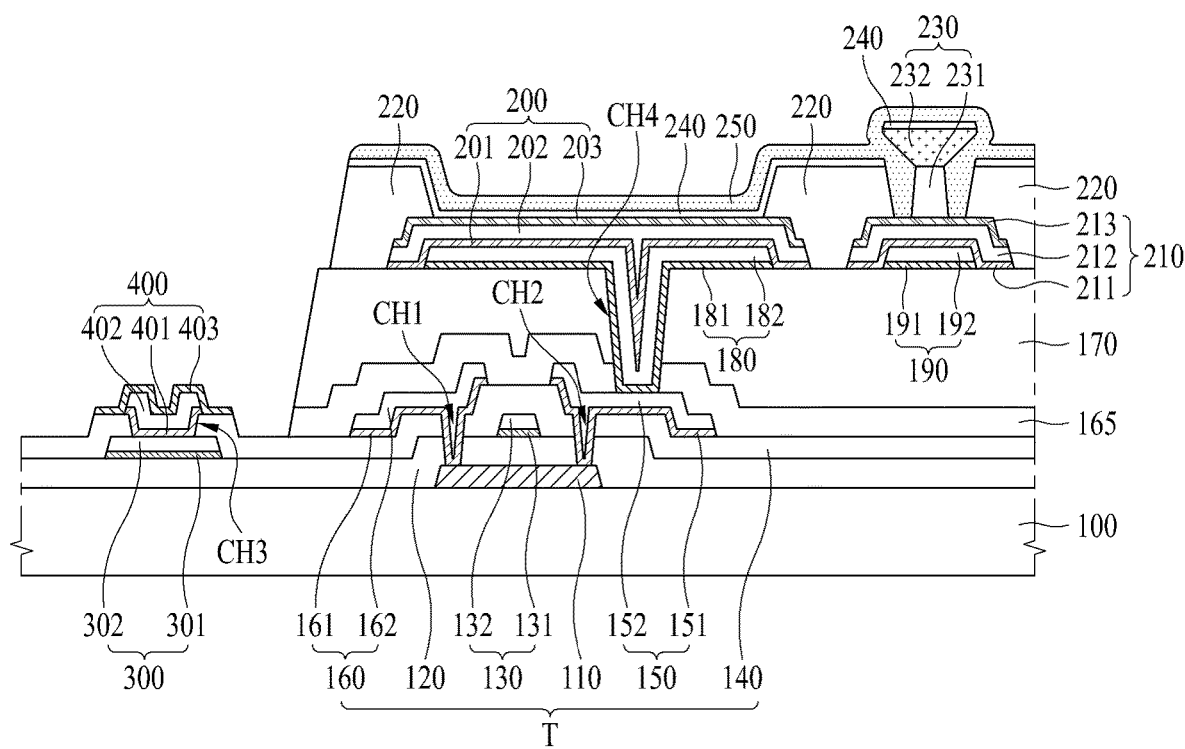

Subsequently, as seen in FIG. 3J, a cathode electrode 250 may be formed on the organic emission layer 240.

The cathode electrode 250 may be formed to be connected to the second auxiliary electrode 210 through the separation space between the partition wall 230 and the bank 220. The cathode electrode 250 may be formed by a deposition process such as a sputtering process which is not good in straightness of a deposited material, and thus, the cathode electrode 250 may be deposited in the separation space between the partition wall 230 and the bank 220 in a process of depositing the cathode electrode 250.

As described above, according to the embodiments of the present invention, since the pad electrode is formed to cover the top of the signal pad, the signal pad is prevented from being corroded. Accordingly, the signal pad may be formed in the two-layer structure which includes the lower signal pad and the upper signal pad vulnerable to corrosion.

Moreover, according to the embodiments of the present invention, the contact hole for externally exposing the source electrode and the area for externally exposing the pad electrode may be simultaneously formed, and thus, one mask process is not additionally performed.

Moreover, according to the embodiments of the present invention, the two auxiliary electrodes (for example, the first auxiliary electrode and the second auxiliary electrode) may be stacked for lowering a resistance of the cathode electrode, and thus, the desired resistance characteristic of the auxiliary electrode is more easily adjusted.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of manufacturing an organic light emitting display device, the method comprising:
    forming a thin film transistor (TFT) in an active area of a substrate and forming a signal pad and a first pad electrode, connected to the signal pad, in a pad area of the substrate;
    forming a passivation layer on the TFT and the first pad electrode;
    forming a planarization layer on the passivation layer;
    removing a certain region of the passivation layer to simultaneously form an area, through which the TFT is exposed to the outside, and an area through which the first pad electrode is exposed to the outside;
    forming a first anode electrode directly connected to the TFT, a first auxiliary electrode spaced apart from the first anode electrode, and a second pad electrode that is connected to the first pad electrode and covers the exposed first pad electrode;

forming a second anode electrode, covering an entire top surface and a side surface of the first anode electrode, a second auxiliary electrode covering a top and a side surface of the first auxiliary electrode and a third pad electrode on the second pad electrode; and removing the third pad electrode, wherein the TFT comprises a source electrode, the forming of the first pad electrode comprises forming a first lower pad electrode and forming a first upper pad electrode, the forming of the second pad electrode comprises forming a second lower pad electrode and forming a second upper pad electrode, the first pad electrode is formed simultaneously with the source electrode, the first anode electrode and the second pad electrode are simultaneously formed, and the second anode electrode, the second auxiliary electrode, and the third pad electrode are simultaneously formed, wherein the second upper pad electrode is removed when the third pad electrode is removed to form a pad electrode including the first lower pad electrode, the first upper pad electrode and the second lower pad electrode, and wherein a portion of the first anode electrode and a portion of the second anode electrode are coplanar directly on the planarization layer.

2. The method of claim 1, wherein
the TFT further comprises a gate electrode, and
the signal pad is formed simultaneously with the gate electrode.

3. The method of claim 1, wherein the forming of the second pad electrode comprises simultaneously removing the third pad electrode and second upper pad electrode by using an etchant in a process of forming the second anode electrode and the second auxiliary electrode.

4. The method of claim 1, further comprising:
forming a bank on each of one side and the other side of the second auxiliary electrode and forming a partition wall on a top of the second auxiliary electrode;
forming an organic emission layer on the second anode electrode not to be deposited in a separation space between the bank and the partition wall; and
forming a cathode electrode on the organic emission layer.

5. The method of claim 1, wherein the third pad electrode is formed to cover a top and a side surface of the second pad electrode.

6. The method of claim 1, wherein the second lower pad electrode is formed on the first pad electrode.

7. The method of claim 1, wherein the second lower pad electrode is provided to cover a top and a side surface of the first upper pad electrode.

8. The method of claim 7, wherein an oxidation rate of each of the first lower pad electrode and the second lower pad electrode is lower than an oxidation rate of the first upper pad electrode, and
a resistance of the first upper pad electrode is lower than a resistance of each of the first lower pad electrode and the second lower pad electrode.

9. The method of claim 1, wherein the second anode electrode comprises a second lower anode electrode, a second center anode electrode, and a second upper anode electrode, and
an oxidation rate of each of the second lower anode electrode and the second upper anode electrode is lower than an oxidation rate of the second center anode electrode, and
a resistance of the second center anode electrode is lower than a resistance of each of the second lower anode electrode and the second upper anode electrode.

10. The method of claim 1, wherein the signal pad comprises a lower signal pad and an upper signal pad on the lower signal pad,
an oxidation rate of the lower signal pad is lower than an oxidation rate of the upper signal pad, and
a resistance of the upper signal pad is lower than a resistance of the lower signal pad.

11. The method of claim 4, wherein the cathode electrode is connected to the second auxiliary electrode through the separation space between the bank and the partition wall.

12. The method of claim 7, wherein a thickness of the first upper pad electrode is larger than that of the first lower pad electrode.

13. The method of claim 1, wherein the first anode electrode comprises a first lower anode electrode and a first upper anode electrode, and
a thickness of the first upper anode electrode is larger than that of the first lower anode electrode.

14. The method of claim 1, wherein the first auxiliary electrode comprises a first lower auxiliary electrode and a first upper auxiliary electrode, and
a thickness of the first upper auxiliary electrode is larger than that of the first lower auxiliary electrode.

15. The method of claim 9, wherein a thickness of the second center anode electrode is larger than that of each of the second lower anode electrode and the second upper anode electrode.

16. The method of claim 4, wherein a width of a top of the partition wall is greater than that of a bottom of the partition wall.

17. The method of claim 7, wherein a thickness of the first upper pad electrode is larger than that of each of the first lower pad electrode and the second lower pad electrode.

* * * * *